United States Patent
Chu et al.

[19]

[11] Patent Number: 6,113,735
[45] Date of Patent: Sep. 5, 2000

[54] DISTRIBUTED SYSTEM AND CODE FOR CONTROL AND AUTOMATION OF PLASMA IMMERSION ION IMPLANTER

[75] Inventors: Paul K. Chu, Kowloon, The Hong Kong Special Administrative Region of the People's Republic of China; A. G. Liu, Harbin, China

[73] Assignee: Silicon Genesis Corporation, Campbell, Calif.

[21] Appl. No.: 09/260,191

[22] Filed: Mar. 1, 1999

Related U.S. Application Data

[60] Provisional application No. 60/076,572, Mar. 2, 1998.

[51] Int. Cl.⁷ ........................................................ C23F 1/02
[52] U.S. Cl. ........................................ 156/345; 118/723 R
[58] Field of Search ........................ 156/345; 118/723 R

[56] References Cited

U.S. PATENT DOCUMENTS

| | | |
|---|---|---|
| 4,808,546 | 2/1989 | Moniwa et al. . |
| 5,183,775 | 2/1993 | Levy . |
| 5,196,355 | 3/1993 | Wittkower . |
| 5,289,010 | 2/1994 | Shohet . |
| 5,296,272 | 3/1994 | Matossian et al. . |
| 5,305,221 | 4/1994 | Atherton . |
| 5,311,028 | 5/1994 | Glavish . |
| 5,342,652 | 8/1994 | Foster et al. . |
| 5,354,381 | 10/1994 | Sheng . |
| 5,380,682 | 1/1995 | Edwards et al. . |
| 5,427,638 | 6/1995 | Goetz et al. . |
| 5,436,175 | 7/1995 | Nakato et al. . |
| 5,476,691 | 12/1995 | Komvopoulos et al. . |
| 5,498,290 | 3/1996 | Matossian et al. . |
| 5,525,159 | 6/1996 | Hama et al. . |
| 5,554,249 | 9/1996 | Hasegawa et al. . |
| 5,554,853 | 9/1996 | Rose . |
| 5,558,718 | 9/1996 | Leung . |
| 5,580,429 | 12/1996 | Chan et al. . |
| 5,641,707 | 6/1997 | Moslehi . |
| 5,661,043 | 8/1997 | Rissman et al. . |
| 5,711,812 | 1/1998 | Chapek et al. . |
| 5,822,172 | 10/1998 | White . |
| 5,854,123 | 12/1998 | Sato et al. . |
| 5,856,674 | 1/1999 | Kellerman . |

FOREIGN PATENT DOCUMENTS

| | | |
|---|---|---|
| WO 93/18201 | 9/1993 | WIPO . |
| WO 99/06110 | 2/1999 | WIPO . |

OTHER PUBLICATIONS

Abstract of Japanese Patent Publication No. JP 03–268444, Published Nov. 29, 1991 entitled "Manufacture of Semiconductor Device".

Abstract of Japanese Patent Publication No. JP 03–019218, Published Jan. 28, 1991 entitled "Formation Process and Device of Soi Substrate".

Hu et al., Proposal No. UCB/ERL–93/19 to: The Air Force of Scientific Research (Jun. 6, 1993 –Jun. 5, 1996), Joint Electronics Program, Bolling Air Force Base, Washington, D.C., pp. 2–7.

Zhang et al., "Low–energy separation by implantation of oxygen structures via plasma source ion implantation" Appl. Phys. Lett. (1994) 65(8):962–964.

*Primary Examiner*—Thi Dang
*Attorney, Agent, or Firm*—Townsend and Townsend and Crew LLP

[57] ABSTRACT

A plasma immersion implantation system (100), including a network for controlling the system. The network communicates to the system by way of packets, which are used to pass signals to and from one of a plurality of controllers. The controllers are used to oversee one of a plurality of processing parameters or field processes such as rf voltage, pressure, etc.

17 Claims, 6 Drawing Sheets

DISTRIBUTED SYSTEM AND CODE FOR CONTROL AND AUTOMATION OF PLASMA IMMERSION ION IMPLANTER

CROSS-REFERENCES TO RELATED APPLICATIONS

The present patent application claims priority to U.S. Provisional Patent Application Ser. No. 60/076,572 filed Mar. 2, 1998, which is hereby incorporated by reference for all purposes.

BACKGROUND OF THE INVENTION

The present invention relates to the manufacture of objects. More particularly, the present invention provides a technique for selectively automating controlling a plasma immersion ion implantation system or plasma source ion implantation system for the manufacture of semiconductor integrated circuits, for example. But it will be recognized that the invention has a wider range of applicability; it can also be applied to other substrates for multi-layered integrated circuit devices, three-dimensional packaging of integrated semiconductor devices, photonic devices, piezoelectronic devices, microelectromechanical systems ("MEMS"), sensors, actuators, solar cells, flat panel displays (e.g., LCD, AMLCD), biological and biomedical devices, and the like. Other types of high voltage systems can also be used with the present invention.

Integrated circuits are fabricated on chips of semiconductor material. These integrated circuits often contain thousands, or even millions, of transistors and other devices. In particular, it is desirable to put as many transistors as possible within a given area of semiconductor because more transistors typically provide greater functionality, and a smaller chip means more chips per wafer and lower costs. Some integrated circuits are fabricated on a slice or wafer, of single-crystal (monocrystalline) silicon, commonly termed a "bulk" silicon wafer. Devices on such "bulk" silicon wafer typically use processing techniques such as ion implantation or the like to introduce impurities or ions into the substrate. These impurities or ions are introduced into the substrate to selectively change the electrical characteristics of the substrate, and therefore devices being formed on the substrate. Ion implantation provides accurate placement of impurities or ions into the substrate. Ion implantation, however, is expensive and generally cannot be used effectively for introducing impurities into a larger substrate such as glass or a semiconductor substrate, which is used for the manufacture of flat panel displays or the like.

Accordingly, plasma treatment of large area substrates such as glass or semiconductor substrates has been proposed or used in the fabrication of flat panel displays or 300 mm silicon wafers. Plasma treatment is commonly called plasma immersion ion implantation ("PIII") or plasma source ion implantation ("PSI"). Plasma treatment generally uses a chamber, which has an inductively coupled plasma source, for generating and maintaining a plasma therein. A large voltage differential between the plasma and the substrate to be implanted accelerates impurities or ions from the plasma into the surface or depth of the substrate. A variety of limitations exist with the convention plasma processing techniques.

A major limitation with conventional plasma processing techniques is the maintenance of the uniformity of the plasma density and chemistry over such a large area is often difficult. As merely an example, inductively or transformer coupled plasma sources ("ICP" and "TCP," respectively) are affected both by difficulties of maintaining plasma uniformity using inductive coil antenna designs. Additionally, these sources are often costly and generally difficult to maintain, in part, because such sources which require large and thick quartz windows for coupling the antenna radiation into the processing chamber. The thick quartz windows often cause an increase in rf power (or reduction in efficiency) due to heat dissipation within the window.

Other techniques such as Electron Cyclotron Resonance ("ECR") and Helicon type sources are limited by the difficulty in scaling the resonant magnetic field to large areas when a single antenna or waveguide is used. Furthermore, most ECR sources utilize microwave power which is more expensive and difficult to tune electrically. Hot cathode plasma sources have been used or proposed. The hot cathode plasma sources often produce contamination of the plasma environment due to the evaporation of cathode material. Alternatively, cold cathode sources have also be used or proposed. These cold cathode sources often produce contamination due to exposure of the cold cathode to the plasma generated.

A pioneering technique has been developed to improve or, perhaps, even replace these conventional sources for implantation of impurities. This technique has been developed by Chung Chan of Waban Technology in Massachusetts, now Silicon Genesis Corporation, and has been described in U.S. Pat. No. 5,653,811 ("Chan"), which is hereby incorporated by reference herein for all purposes. In one embodiment, Chan generally describes techniques for treating a substrate with a plasma with an improved plasma processing system. The improved plasma processing system, includes, among other elements, at least two rf sources, which are operative to generate a plasma in a vacuum chamber. It is still desirable, however, to provide even a more uniform plasma and control of the implant for the manufacture of substrates.

Other drawbacks also exist with these conventional techniques. For example, some of these techniques rely upon high voltage sources and/or modulators. These high voltage sources can create unwanted multi-path effects, which undesirably cause "noise" in some of the control circuitry. The unwanted noise can influence one or more of the controllers, which are often analog in form, to are used to control one or more processing parameters. Since noise can influence the control, desirable control may not be achieved by way of conventional analog control systems. Additionally, any lack of control can also be undesirable to health, safety, and the environment.

From the above, it is seen that an improved technique for controlling plasma immersion implantation systems is highly desired.

SUMMARY OF THE INVENTION

According to the present invention, an improved technique for controlling a plasma immersion system is provided. In an exemplary embodiment, the present invention provides a novel plasma immersion ion implantation, automation, distributed control system, network. The distributed control system allows the present system to operate without a substantial influence of "noise" from high voltage energy sources.

In a specific embodiment, the present invention provides novel a plasma treatment system for implantation. The plasma treatment system includes a chamber in which a plasma is generated. The system also has a susceptor disposed in the chamber to support a workpiece to be processed. The workpiece can include, for example, a silicon substrate, a flat panel, among others. The system also has a first control station coupled to a first rf voltage source that provides an electromagnetic field used to maintain the plasma discharge in the chamber. The first rf voltage source can be an inductive coil, which is disposed around a periphery or an upper portion of the chamber. Alternatively, a capacitively coupled plate or coil also can be used. A second control station is coupled to a voltage modulator source for biasing the plasma discharge relative to the susceptor to accelerate a plurality of charged particles from the plasma into the workpiece. The charged particles can be used for a layer transfer process or a doping process. A management station is coupled to the first control station, and is coupled to the second control station using a network configuration. The management station can be a personal computer, laptop computer, network computer, and the like.

Numerous advantages or benefits are achieved by way of the present invention over conventional techniques. The present invention provides a novel control system, which is based upon a network, to reduce interference "noise" caused by electromagnetic radiation from high energy sources of plasma processing tools. In certain embodiments, the present invention provides the analog control to the process near the process, which reduces any influence caused by conventional analog cables, which tend to be long and subject to multipath influences. The present invention provides a management station, which is immune to noise, by way of its distance or proximity to the high energy sources. The management station receives and/or transmits digital signals, which are in the form of packets, from and/or to the controllers near the process. The digital signals are substantially immune to interference caused by electromagnetic radiation. Depending upon the embodiment, one or more of these benefits may be present. These benefits, and others, will be described more fully below.

These and other embodiments of the present invention, as well as its advantages and features are described in more detail in conjunction with the text below and attached FIGS.

DESCRIPTION OF THE SPECIFIC EMBODIMENTS

The present invention provides an improved control technique for plasma immersion ion implantation. In an exemplary embodiment, the present invention provides a distributed control system (herein "PIIIDCS") to partially or fully automate a PIII system, which is substantially free from unwanted noise from high energy sources. The present control system enhances reliability of the PIII system. To fully understand the present invention, it may assist the reader to understand some of the limitations with conventional techniques. The inventors of the present invention uncovered these limitations.

An ever increasing demand by industry to improve materials surface properties has translated into a development in surface modification technology. Plasma immersion ion implantation ("PIII"), has been demonstrated by J. R. Conrad, et al. in the late 1980's, is showing commercial potential in the fields of metallurgy, surface modification, as well as semiconductor processing. In PIII, ions generated by a plasma source are accelerated by a negative voltage applied to a sample and implanted conformally into the target. The high voltage and the associated electric field from the plasma generators, especially the radio frequency plasma source, MEVVA plasma sources, filament glow discharge, and sample high voltage cause strong interferences to electronics and impose a challenge for a control and automation system for PIII. Conventional PIII facilities are usually equipped with relatively crude control systems, and most of them are even manually controlled. The lack of a robust and reliable control system is a formidable obstacle for the commercialization of PIII.

The conventional PIII control system can use a single computer to accomplish all the tasks such as data collection, data management, data logging, control logic management, computation, and so on. All the field points are usually connected to the computer I/O interface by cables that can be very long when the field points are far from the computer, and such a system is thus prone to electromagnetic field interference. It can be so serious that the system does not work properly or even gets damaged if large analog signals find their way into in the system via the long cables. The system is also constrained by the I/O ability of the computer, and signal loss in the long cables can be substantial. Hence, the higher the level of integration, the more serious is the interference problem. Such a simple system cannot be expanded easily to accommodate larger systems and so it is not suitable for commercial PIII equipment. Accordingly it is desirable to find an improved control system for use with PIII.

Figure 1:
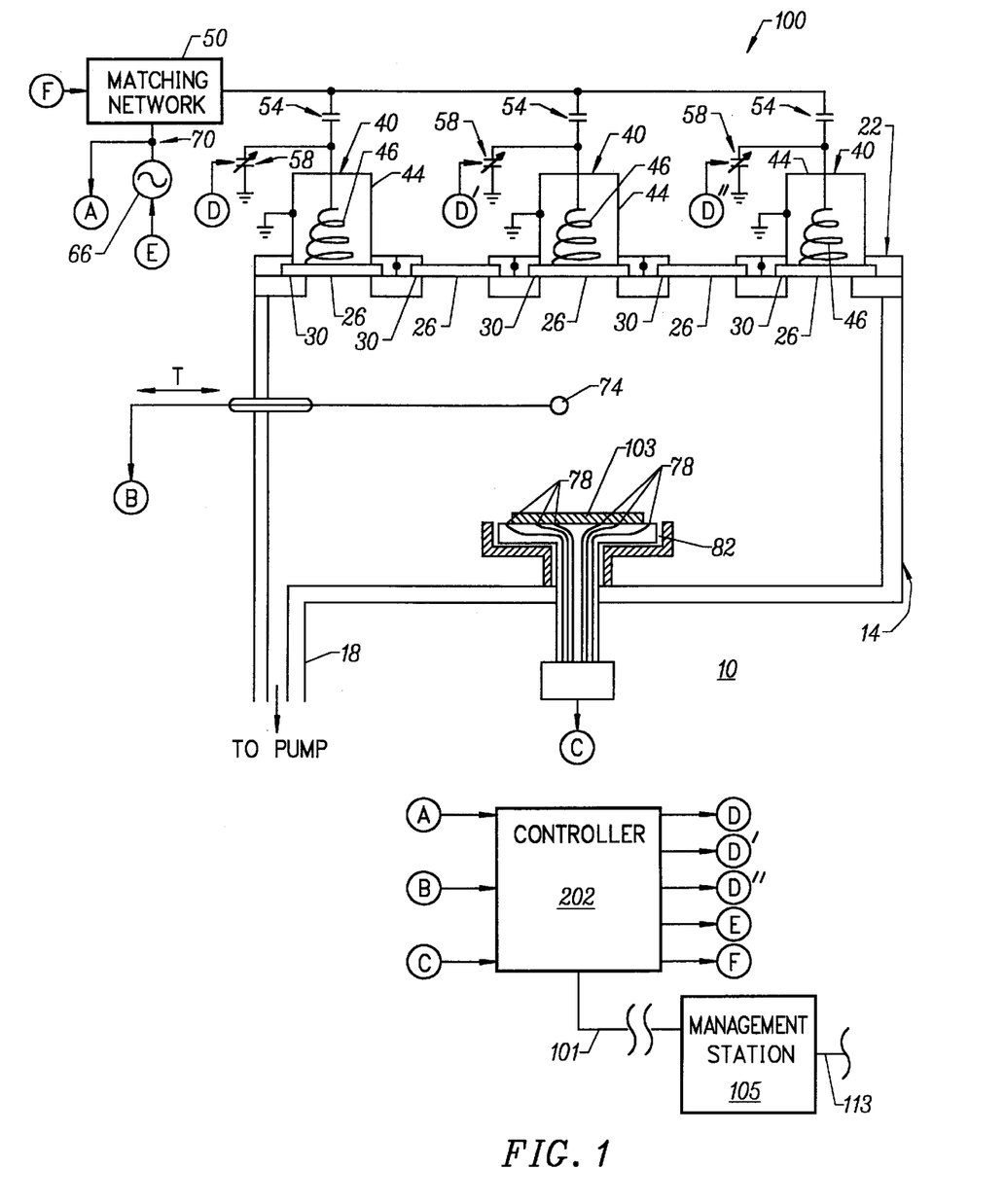
FIG. 1 is a simplified block diagram of a plasma treatment system according to an embodiment of the present invention.

FIG. 1 is a simplified overview of a plasma treatment system 100 for implanting impurities according to an embodiment of the present invention. This diagram is merely and illustration and should not limit the scope of the claims herein. One of ordinary skill in the art would recognize other variations, modifications, and alternatives. In a specific embodiment, system 100 includes a vacuum chamber 14 having a vacuum port 18 connected to a vacuum pump (not shown). The system 100 includes a series of dielectric windows 26 vacuum sealed by o-rings 30 and attached by removable clamps 34 to the upper surface 22 of the vacuum chamber 14. Removably attached to some of these dielectric windows 26 are rf plasma sources 40, in one embodiment having a helical or pancake antennae 46 located within an outer shield/ground 44. Other embodiments of the antennae using capacitive or inductive coupling may be used. Cooling of each antenna is accomplished by passing a cooling fluid through the antenna. Cooling is typically required only at higher power. The windows 26 without attached rf plasma sources 40 are usable as viewing ports into the chamber 14. The removability of each plasma source 40 permits the associated dielectric window 26 to be cleaned or the plasma source 40 replaced without the vacuum within the system 100 being removed. Although glass windows are used in this embodiment, other dielectric material such as quartz or polyethylene may be used for the window material.

Each antenna 46 is connected to a rf generator 66 through a matching network 50, through a coupling capacitor 54. Each antenna 46 also includes a tuning capacitor 58 connected in parallel with its respective antenna 46. Each of the tuning capacitors 58 is controlled by a signal D, D', D" from a controller 202, which is actually a plurality of controllers. By individually adjusting the tuning capacitors 85, the output power from each rf antenna 46 can be adjusted to maintain the uniformity of the plasma generated. Other tuning means such as zero reflective power tuning may also be used to adjust the power to the antennae. In one embodiment, the rf generator 66 is controlled by a signal E from the controller 202. In one embodiment, the controller 202 controls the power to the antennae 46 by a signal F to the matching network 50. The controller is coupled to a management station 105. The management station is coupled to the controller via a network interface. The management station also is coupled to an external network 113, which can be a wide area network or a local area network.

The controller 202 adjusts the tuning capacitors 58 and the rf generator 66 in response to a signal A from a sensor 70 (such as a Real Power Monitor by Comdel, Inc., Beverly, Mass.) monitoring the power delivered to the antennae 46, a signal B from a fast scanning Langmuir probe 74 directly measuring the plasma density and a signal C from a plurality of Faraday cups 78 attached to a substrate wafer holder 82. The Langmuir probe 74 is scanned by moving the probe (double arrow I) into and out of the plasma. With these sensors, the settings for the rf generator 66 and the tuning capacitors 58 may be determined by the controller prior to the actual use of the system 100 to plasma treat a substrate. Once the settings are determined, the probes are removed and the wafer to be treated is introduced. In another embodiment of the system, the probes are left in place during processing to permit real time control of the system. In such an embodiment using a Langmuir probe, care should be taken to not contaminate the plasma with particles evaporating from the probe and to not shadow the substrate being processed. In yet another embodiment of the system, the characteristics of the system are determined at manufacture and the system does not include plasma probe.

Although the above is generally described in terms of specific PIII hardware, other types of hardware can also be used. For example, the PIII system can include a single rf coil, rather than multiple rf coils, which is disposed on an upper surface or top of the chamber. The chamber design has been shown using a substantially planar dielectric rf window. Other types of chamber designs such as a domed chamber design and others may be used. The domed chamber design can be one made by, for example, Applied Materials, Inc. of Santa Clara, Calif. Furthermore, the present system is shown by way of an inductive discharge. Other types of discharges such as a capacitive discharge made by way of electrodes in parallel alignment with each other in the chamber can also be used. One capacitive discharge for PIII is shown in U.S. Pat. No. 5,354,381, assigned to Varian Associates, Inc., and in the name of Terry T. Sheung, which is incorporated by reference herein. Another capacitive discharge for PIII is shown in U.S. Pat. No. 5,654,043, assigned to Eaton Corporation, and in the names of Shao, et al., which is incorporated by reference herein.

Figure 2:
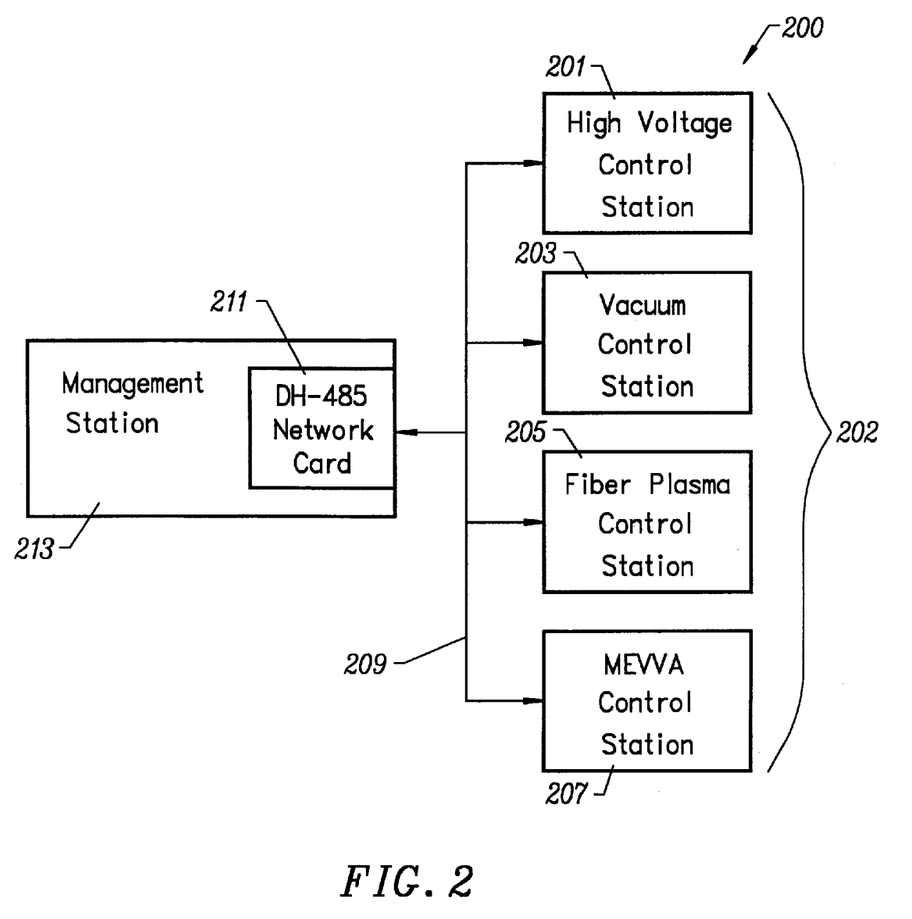
FIGS. 2–6 are simplified diagrams of plasma treatment systems according to embodiments of the present invention.

In order to overcome shortcomings of conventional PIII control systems and improve their efficiency, a novel distributed control system ("PIIIDCS") is provided. The distributed control system uses a management station and a controller, such as the one shown above but can be others. As merely an example, FIG. 2 is a simplified diagram of a distributed control system 200 according to an embodiment of the present invention. This diagram 200 is merely an illustration, which should not limit the scope of the claims herein. One of ordinary skill in the art would recognize other variations, modifications, and alternatives. The present control system 200 includes, among other elements, the controller, which is actually a plurality of field controllers 201, 203, 205, 207, a communication network 209, and an operation and management station 213.

The present system 200 also includes a network card 211, which is coupled to the management station 213. In a specific embodiment, the present system can include a high voltage control station 201, a vacuum control station 203, a fiber plasma control station 205, and a MEVVA control station 207. Any one of or more of these stations can be eliminated or others can be added depending upon the embodiment. The field controllers collect data from the field (i.e., equipment elements) and carry out control commands. The equipment elements include vacuum pump, high voltage modulator source, high voltage rf source, among others. The operation and management station is responsible for data logging, system status monitoring, failure warning, and overseeing and controlling other equipment functions. The management station can also be the main machine interface. The communication network provides the data transfer channels between the management station and the controllers.

In a specific embodiment, the field controllers can be used in lieu of the conventional central computer, which is often responsible for data collection and instrument control. The field controllers can also be used in combination with the central computer in other embodiments. The field controllers can be arranged according to a distribution of the field points to make hard wiring such as cables as short as possible. For example, the distance between the field controller and the field point can be ten feet or less, or five feet or less, or two feet or less, or preferably one foot or less. Analog control signals pass between the field controller and the field point. The field point can include, for example, high voltge supply, sample stage—high voltage feedthrough, vacuum gauges, MEVVA sources, RF sources, and so on. In a specific embodiment, the field controllers carry out control tasks of the PIIIDCS system. In preferred embodiments to achieve reduced interference and in order to satisfy the antiinterference and quick response requirements, the field controllers should each be arranged as close to its field point, as noted. The controllers should also take in account a real time operation as the controllers should handle communication functions. Field controllers in the system oversee different control tasks, but to some degree, their functions are similar. Main operations can be sequential control, continuous control, data collection, data transmission, failure/error warning to the management station, and communication among each other.

Communication between the controllers and management station can be accomplished by serial or parallel signals that are insensitive to electromagnetic interference. This arrangement can alleviate a wide variety of interference problems caused by analog signals inadvertently interfering with the system. The effectiveness of such a system can be selectively adjusted by the type and performance of field controllers, the management station, and network. In a specific embodiment, the communication between the management station and the field controllers occurs by way of packet communication. Here, the packet includes a header and data, which is characteristic of the process parameter being monitored. The packet communication is fairly robust and allows the present system to be substantially immune to noise and the like.

As merely an example, the present system can use off the shelf hardware and software to create an efficient and cost effective system. The present system can use as a field controller a programmable logic controller ("PLC"). Due to the scale of the present system, for example, SLC500 serial products from Allen-Bradley can be selected. The products can be designed with special anti-interference consideration and function properly in a high field environment. As the hardware is modular, expansion can be readily implemented. In particular, the 1747-L524 CPU mode with built-in 4 k RAM can process as many as 480 discrete I/O points. Other types of controllers can also be used. The present system is also compatible with many digital and analog I/O modules. The present system also provides a standard DH-485 and DH+ network communication interface. Of course, the present example is merely illustrative and should not limit the scope of the claims herein. Details of system flow can be shown below in the FIG.

Figure 3:
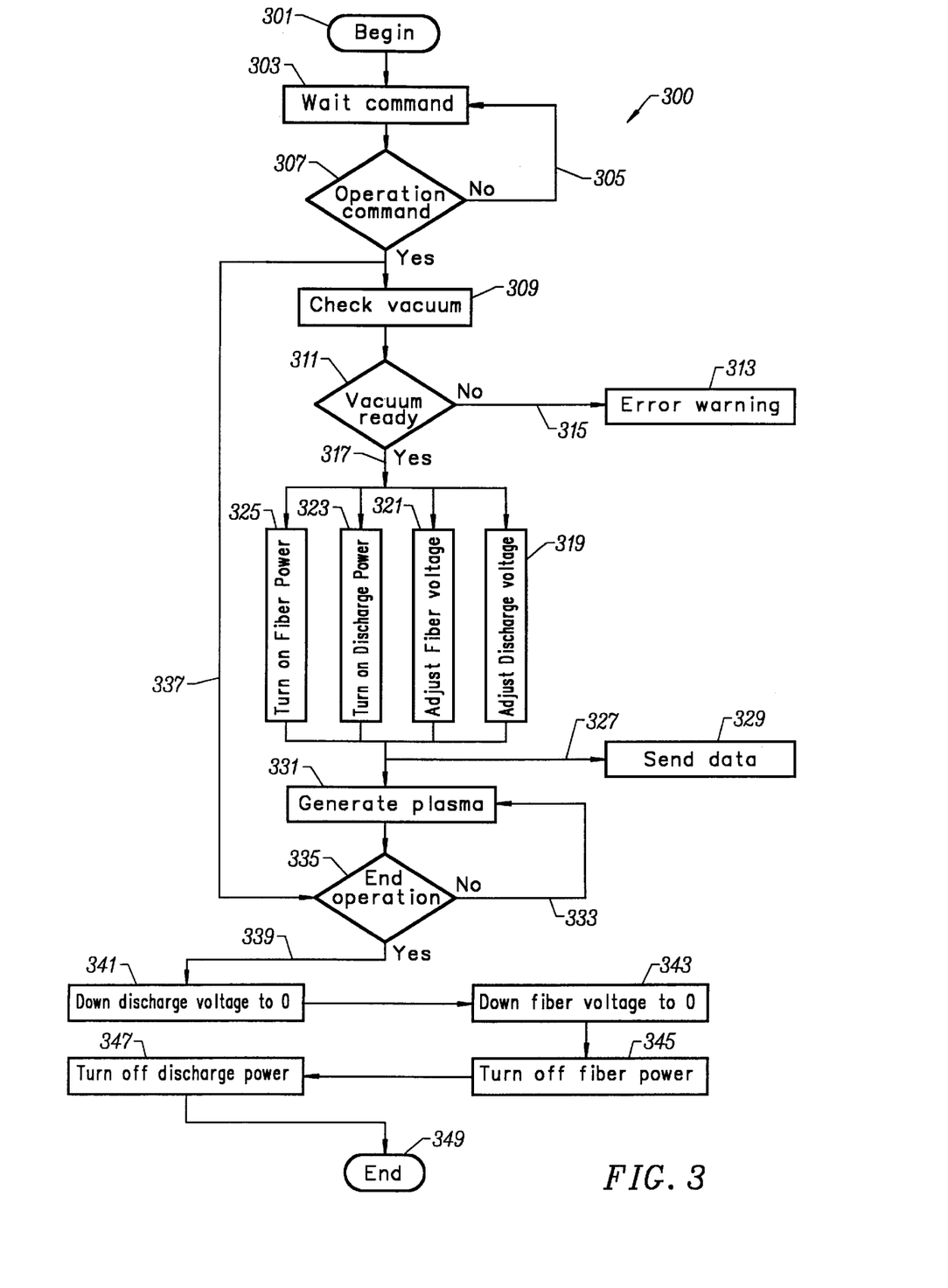

As merely an example, FIG. 3 is a simplified flow diagram 300 of a fiber plasma source controller process according to an embodiment of the present invention. The flow diagram is merely an example and should not limit the scope of the claims herein. One of ordinary skill in the art would recognize other variations, modifications, and alternatives. The present process starts at begin, step 301. Here, the process is executed using a computer program or the like. After the program is executed, the controller waits (step 303) for an operation command (step 307) from the management station. If no operation command is provided, the process loops back to wait via branch 305. If an "END OPERATION" command is prompted, the process ends operation, step 335, via branch 337. If it is anything other than "END OPERATION", the controller checks the vacuum data (step 309) sent by the vacuum controller. If the pressure is within the working range, the controller will carry out the operation command via branch 317. Alternatively, the controller sends an error warning message (step 313) via branch 315. The operation command turns on a plurality of switches, which turn on or adjust a plurality of system elements.

In a specific embodiment, these elements include fiber power, discharge power, and their adjustments. Here, the process turns on the fiber power, step 325. The process turns on the discharge power, step 323. The process adjusts the fiber voltage, step 321. The process adjusts the discharge voltage, step 319. In some embodiments, these can be turned on in parallel or serial or a combination of parallel and serial depending upon the application. Once these elements are adjusted to their desired conditions, the plasma can be ignited automatically, generated, and maintained, step 331.

The process sends (step 329) voltage and current data to the management station via the network, such as the one noted above but can be others. If the pressure is out of the working range, the controller will send an error message to the management station. If "END OPERATION" is not prompted, the process returns to step 331 via branch 333. If the operation command is "END OPERATION" (step 335), the controller can execute the stop procedure via branch 339. The stop procedure turns the discharge voltage down to zero, step 314; turns the fiber voltage down to zero, step 343; turns the fiber power off, step 345; and turns the discharge power off, step 347. The process is them complete, step 349, which indicates that the fiber source is down. This sequence of steps is merely an example, which should not limit the scope of the claims herein.

The above sequence of steps can be carried out with a combination of computer hardware and software. Functionality of any of the steps can be further combined as well as separated. Additionally, the functionality can be more integrated in the form of software, as well as further separated in the form of software. The functionality can also be in the form of hardware, which further combines or even separates the functionality. Other ways of implementing the present functionality can be used without departing from the spirit of the present invention, which is provided by the claims below. Additionally, the present process can be applied to other system elements, such as those noted, as well as others.

In a preferred embodiment, the present system includes a novel network to carry one of a plurality of communication signals, rather than employing control cables to carry the control signals. Accordingly, a substantial portion of interference caused by electromagnetic radiation from high voltage sources is reduced. The network system is constructed such that the controller receives a control command sent by the management station in time. The network is also constructed such that the management station receives data and failure warnings from the controllers correctly. The network also ensures that the controllers work in a synchronous way.

In order to make a more robust system an industrial environment such as a fabrication facility for semiconductor devices, hardware, automobile parts, and other stuff, a serial communication standard such as DH-485 protocol (that is consistent with RS-485 on the physical layer) can be used to construct the network. This protocol can support 32 nodes in the network, and the maximum transmission distance can reach up to 1219 meters. Twist-pair cables can be used to transmit signals in a differential way. Consequently, high interference resistance can be achieved at a low cost. In other embodiments, other networks can be used. As merely an example for medium applications, a token ring method can be used. Token ring provides maximum transmission time to substantially all token passing procedures, and priority schemes arc easy to implement. Such procedures can be more suitable for real time applications than CSMA/CD.

Figure 4:
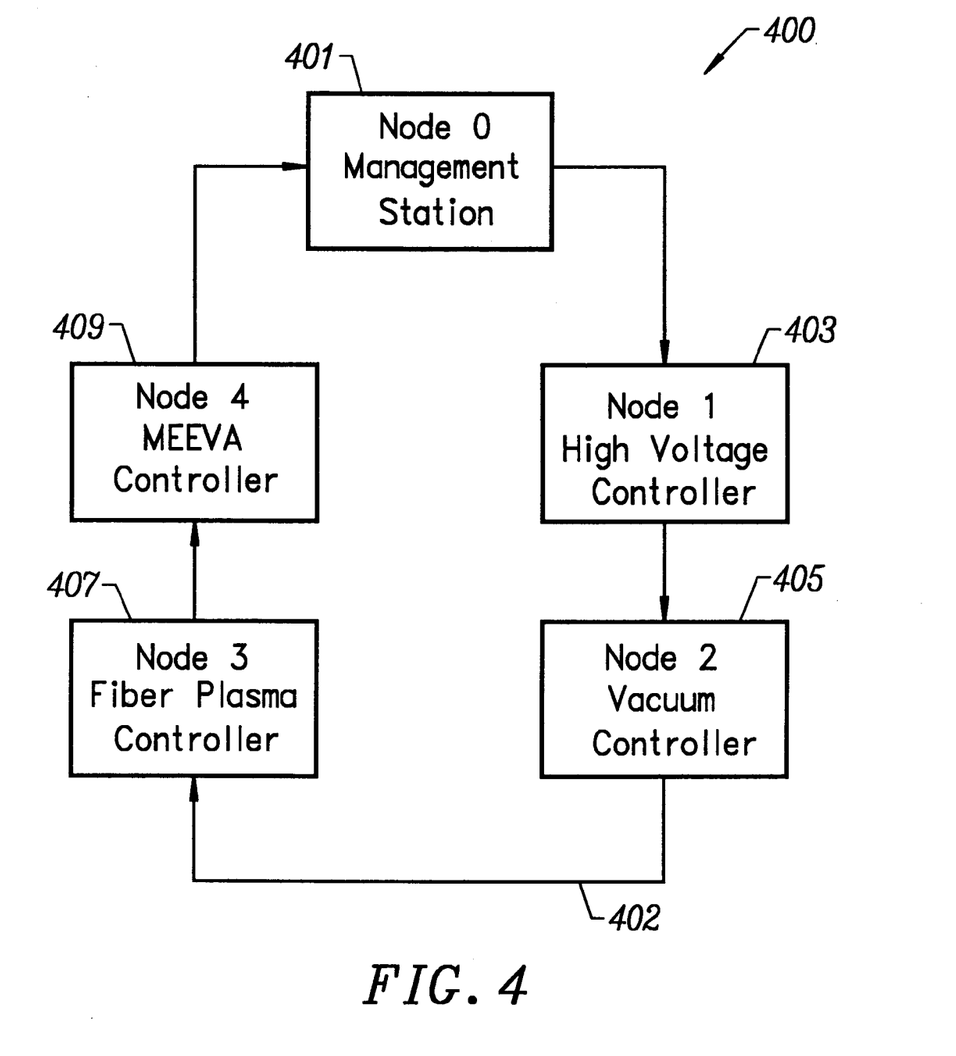

In a specific embodiment, the present network system includes a bus structure pattern. The logic structure, however, can be a ring pattern, i.e., token ring. As merely an example, FIG. 4 is a simplified diagram 400 of a ring pattern for a logic structure for a network according to the present invention. This logic structure is merely an example and should not limit the scope of the claims herein. One of ordinary skill in the art would recognize other variations, modifications, and alternatives. As shown, the present structure includes five nodes such as Node 0, Node 1, Node 2, Node 3, and Node 4. Node 0 corresponds to the management station. Node 1 corresponds to the high voltage controller. Node 2 corresponds to the vacuum controller. Node 3 corresponds to the fiber plasma controller, and Node 4 corresponds a MEEVA controller. Any one or more of these nodes can be eliminated. Other nodes can also be added, depending upon the embodiment.

As shown, each of the controllers can be divided into a transmitter and receiver. When the present network 402 is running, any transmitter can send valid packets onto the network. To determine which is the authorized transmitter, a token is needed. During network initialization, the management station which is assigned the lowest address holds the token initially and performs the network establishment procedure, which begins when the management station starts sending the token to the successive node. If the trial fails, it begins a linear search for the higher addresses until another node is found, and the token is sent to this node. The procedure is repeated until the token returns to the management station. In a normal operation, the token holder sends the data packets to the network. In PIIIDCS, there are not a lot of data to transmit, but the data are sent very frequently to each controller. Packets are transmitted when the controller catches the token and the token is subsequently sent to the next node. If no data are to be transmitted, the token is sent to the next node directly. This example is merely an illustration and should not limit the scope of the claims herein.

Although the controllers can accomplish data collection and control tasks efficiently according the preset program, it may be difficult for an operator to vary the process while it is running. Accordingly, the management station of PIIIDCS provides functions such as control and adjustment, animation, flow charts, historical records, warning, and printing. These functions can be accomplished effectively with a personal computer such as those using an Intel™ based microprocessor and the like. Even though a personal computer has very poor interference resistance, the network can provide the long distance connections to the management station, and so that interference is not a problem for the distant management station. Here, the personal computer is placed at a predetermined distance away from the process. The predetermined distance is selected to keep the personal computer substantially free from electromagnetic interference from the process. Alternatively, the personal computer can be shielded or filtered from any interference from electromagnetic radiation.

Figure 6:
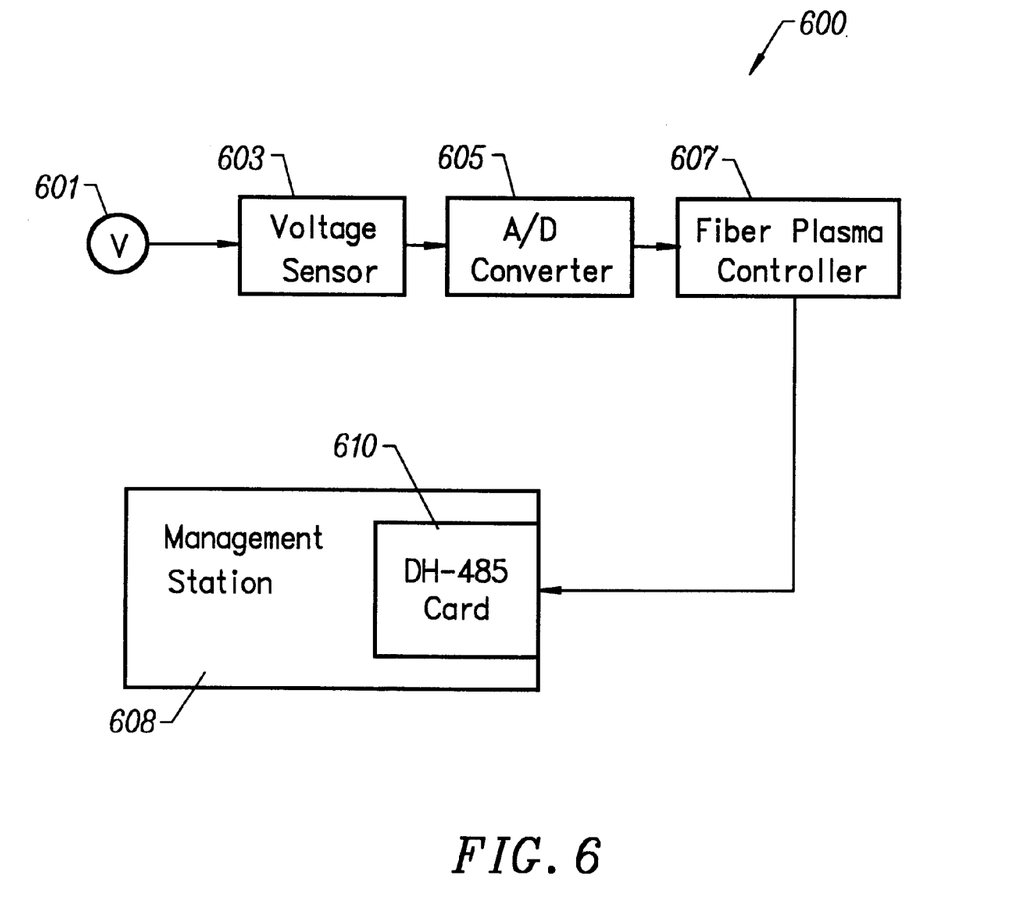

FIG. 6 is a simplified diagram of a operator interface 500 according to an embodiment of the present invention. This diagram is merely an illustration and should not limit the scope of the claims herein. One of ordinary skill in the art would recognize other variations, modifications, and alternatives. The present interface 500 is provided on a computer display 501. The display can be on a flat panel, CRT, or the like. For convenience of operation, the present interface (or graphical user display) is designed to run in a graphic mode under Microsoft Windows95™, as well as other operating systems. As shown, the user interface has a first display portion 503, which shows Fiber Voltage and Fiber Current. The interface also has a second display portion 505, which shows Discharge Voltage and Discharge Current. A FIBER POWER button 507 and DISCHARGE POWER button 509 are related to bits b3:0/0 and b3:0/3 in the fiber plasma source controller through a communication driver. When the power is off, the POWER buttons are green. The power will come on if the button is pressed using the mouse, and the buttons turns to red. Power will be turned off if the red button is triggered also. The interface also has switches 510, which can be turned on or off by way of a mouse. This description of the user interface is merely an example. The example shows that the present invention can be applied in a manner that is relatively easy for an operator to use. Other types of user interfaces can also be used, depending upon the application.

Figure 5:
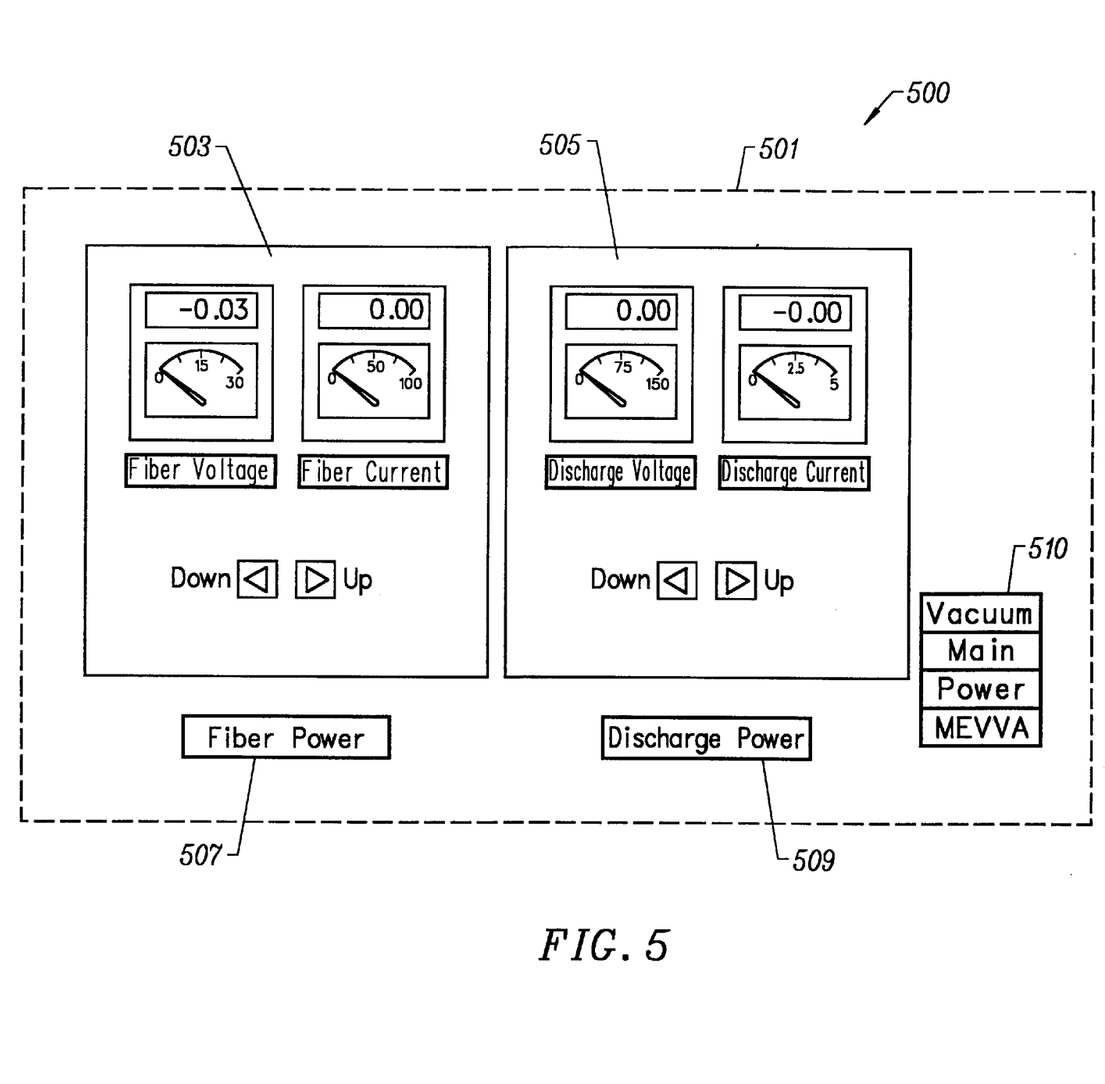

FIG. 5 is a simplified flow diagram 600 of a fiber voltage signal according to an embodiment of the present invention. The diagram is merely an illustration, which should not limit the scope of the claims herein. One of ordinary skill in the art would recognize other variations, modifications, and alternatives. Here, process parameters 601 such as a fiber voltage, fiber current, discharge voltage and discharge current can be measured using sensors (step 603), which convert the parameters into analog signals. The analog signals are converted into digital by way of an A/D converter, step 605. The converted signals, which are now digital, are sent to a CPU of the controller, step 607. Scaling of the signal can be performed in the controller, and the scaled data are transmitted to the management station (step 608) via a network. The data are displayed on the monitor screen in digital and/or analog form for accurate visual assessment. New data are sent to the management station continuously or in-situ, and the screen refreshes in real time.

Although the above has been generally described in terms of a PIII system, the present invention can also be applied to a variety of other plasma systems. For example, the present invention can be applied to a plasma source ion implantation system. Alternatively, the present invention can be applied to almost any plasma system where extreme amounts of electromagnetic radiation influence control aspects of the system. Accordingly, the above description is merely an example and should not limit the scope of the claims herein. One of ordinary skill in the art would recognize other variations, alternatives, and modifications.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A plasma treatment system for implantation, said system comprising:

a chamber in which a plasma is generated in said chamber;

a susceptor disposed in said chamber, said susceptor being capable of holding a workpiece to be processed;

a first control station coupled to a rf voltage source for providing an electromagnetic field used to maintain said plasma discharge in said chamber;

a second control station a voltage modulator source for biasing said plasma discharge relative to said susceptor to accelerate a plurality of charged particles from said plasma into said workpiece; and a management station coupled to said first control station and coupled to said second control station.

2. The system of claim 1 wherein said management station comprises a network card, said network card coupling said first control station to said management station.

3. The system of claim 1 wherein said management station comprises a network card, said network card coupling said first control station to said management station.

4. The system of claim 1 further comprising a tuning circuit, said tuning circuit electrically connected to said rf voltage source.

5. The system of claim 1 wherein said management station and said first control station being coupled through a conductive member.

6. The system of claim 1 wherein said management station is substantially free from electromagnetic interference from said rf voltage source.

7. The system of claim 1 wherein said management station is substantially free from electromagnetic interference from said voltage modulator source.

8. The system of claim 1 wherein said management station receives telecommunication signals from said first control station.

9. The system of claim 1 wherein said management station receives telecommunication signals from said second control station.

10. The system of claim 1 wherein said first control station provide control signals to said rf voltage source.

11. The system of claim 1 wherein said system is provided in a cluster tool.

12. The system of claim 1 wherein said management station communicates to said first station by passing a plurality of first packets to and from said first control station.

13. The system of claim 1 wherein said management station communicates to said second station by passing a plurality of second packets to and from said second control station.

14. A plasma immersion implantation system comprising:

a management station comprising a computer memory, said computer memory including a first code directed to transmit a plurality of first packets between said management station and at least one of a plurality of controllers, said one of said controllers being coupled to a field process to adjust said field process using an analog control signal.

15. The system of claim 14 wherein said management station comprises a personal comptuer, said personal computer including a microprocessor device.

16. The system of claim 14 wherein said management station is substantially free from any interference from electromagnetic radiation caused by said field process.

17. The system of claim 14 wherein said field process is selected from a high voltage source, a high voltage rf source, and a voltage modulator.

* * * * *